United States Patent
Puchner et al.

(10) Patent No.: US 6,734,081 B1
(45) Date of Patent: May 11, 2004

(54) SHALLOW TRENCH ISOLATION STRUCTURE FOR LASER THERMAL PROCESSING

(75) Inventors: Helmut Puchner, Santa Clara, CA (US); Venkatesh P. Gopinath, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/999,848

(22) Filed: Oct. 24, 2001

(51) Int. Cl.⁷ .................. H01L 21/76; H01L 21/268
(52) U.S. Cl. .............. 438/432; 438/308; 438/535; 438/540
(58) Field of Search ................ 438/308, 432, 438/535, 540

(56) References Cited

U.S. PATENT DOCUMENTS

| | | | |
|---|---|---|---|
| 5,453,713 A | 9/1995 | Partovi et al. | 327/565 |
| 5,498,566 A * | 3/1996 | Lee | 438/432 |
| 5,872,045 A * | 2/1999 | Lou et al. | 438/32 |
| 5,956,603 A * | 9/1999 | Talwar et al. | 438/522 |
| 6,291,302 B1 * | 9/2001 | Yu | 438/308 |
| 6,337,506 B2 | 1/2002 | Morishita et al. | 257/500 |
| 6,361,874 B1 * | 3/2002 | Yu | 428/514 |
| 6,365,476 B1 * | 4/2002 | Talwar et al. | 438/308 |

OTHER PUBLICATIONS

B. Yu et al. 70nm MOSFET with Ultra–Shallow, Abrupt, and Super–Doped S/D Extension Implemented by Laser Thermal Process (LTP). IEDM 1999, pp. 509–512.*

* cited by examiner

Primary Examiner—Long Pham
Assistant Examiner—Anh Duy Mai
(74) Attorney, Agent, or Firm—Beyer Weaver & Thomas, LLP

(57) ABSTRACT

Provided are methods and composition for forming an isolation structure on an integrated circuit substrate. A trench is etched in the integrated circuit substrate. A light barrier layer is then formed in the trench such that the light barrier layer at least partially fills the trench to create an isolation structure, the light barrier layer being adapted for absorbing laser light applied during laser thermal processing, thereby preventing damage to the integrated circuit substrate. For instance, the light barrier layer may be a conductive layer such as polysilicon. A dielectric layer is then formed over the isolation structure. The dielectric layer may be adapted for transferring heat generated by the laser thermal processing to the light barrier layer. For instance, the dielectric layer may be formed through oxidation of a top surface of the light barrier layer.

17 Claims, 1 Drawing Sheet

SHALLOW TRENCH ISOLATION STRUCTURE FOR LASER THERMAL PROCESSING

BACKGROUND OF THE INVENTION

1. Field of the Invention

The present invention relates to the formation of a shallow trench isolation structure in semiconductor wafer fabrication. More particularly, the present invention relates to the formation of a shallow trench isolation structure for laser thermal processing.

2. Description of the Related Art

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Layers are typically either grown (for example, thermal oxidation of silicon to grow a silicon dioxide dielectric layer) or deposited by a variety of techniques such as chemical vapor deposition (CVD) and physical vapor deposition (PVD), including evaporation and sputtering. Patterning, is an operation that is used to remove specific portions of the top layer or layers on the wafer surface. Patterning is usually accomplished through the use of photolithography (also known as photomasking) to transfer the semiconductor design to the wafer surface.

Patterning is often used to expose an area to be etched, such as to create a trench for creation of an isolation structure. More particularly, isolation structures are often created, for instance, to separate different devices from one another, as well as to separate source and drain regions within a particular semiconductor device.

Semiconductor device sizes have decreased dramatically over the years. In order to accommodate sub-micron IC feature sizes, various technologies have been developed and applied. Since IC feature sizes are small, shallow junctions are used, for example, to create source and drain regions.

In order to create a shallow junction, rapid thermal annealing processes are commonly used. Recently, laser thermal processing became available in semiconductor manufacturing. During laser annealing, the silicon substrate material is subjected to laser light emitted from a laser source. Depending upon the wavelength and fluence of the photons, the photons penetrate the surface of the substrate material and dissipate their energy within the substrate surface layer, resulting in heat generation. Depending on the application, the wavelength and energy can be chosen to partially or fully melt the substrate surface layer. During the cooling period, dopants residing in the substrate are recrystallized at substitutional lattice sites and are therefore electrically activated.

During the fabrication of shallow junctions, the isolation structures are also exposed to the laser source. The isolation material of choice for current technologies is silicon dioxide. More particularly, either Shallow Trench Isolation (STI) or Local oxidation of Silicon (LOCOS) silicon dioxide is used to separate adjacent devices. Since silicon dioxide is transparent to laser light, it cannot be used as a blocking layer during laser thermal processing. Rather, the light is reflected only when the thickness of the silicon dioxide layer is a multiple of the wavelength of the laser light. Due to the fact that the isolation structure is transparent, the silicon substrate underneath the isolation may be melted by the laser light and cause a short of adjacent device wells.

In addition to the damage to the device underlying the isolation, there is also a possibility of damage to device structures overlying the isolation. For instance, a polysilicon gate overlying the isolation will generate heat during the laser annealing process. This heat will generally remain within the polysilicon gate, melting the polysilicon gate and effecting the operation of the resulting chip.

In view of the above, what is needed are methods and compositions for defining an isolation structure which prevents the melting of device structures as well as the silicon substrate underneath the isolation structure for use in conjunction with laser thermal processing during semiconductor fabrication.

SUMMARY OF THE INVENTION

The present invention provides methods and apparatus for forming an isolation structure on an integrated circuit substrate. This is accomplished through providing a two-layer isolation structure in which the upper layer enables laser light to be transferred to the lower layer, which absorbs heat generated during laser thermal processing. In this manner, the isolation structure is advantageously designed to avoid melting of device structures as well as the integrated circuit substrate during laser thermal processing.

In accordance with one embodiment, an isolation structure is formed on an integrated circuit substrate. A trench is etched in the trench such that the light barrier layer at least partially fills the trench to create a light barrier structure. The light barrier layer is adapted for absorbing laser light applied during laser thermal processing, thereby preventing damage to the integrated circuit substrate. For instance, the light barrier layer may be a conductive layer such as polysilicon. A dielectric layer is then formed over the light barrier structure. The dielectric layer may be adapted for transferring heat generated by the laser thermal processing to the light barrier structure. For instance, the dielectric layer may be formed through oxidation of a top surface of the light barrier layer or light barrier structure.

In accordance with another embodiment, an isolation structure formed on an integrated circuit substrate includes a trench and a light barrier layer in the trench forming a light barrier structure. The light barrier structure is adapted for absorbing laser light applied during laser thermal processing, thereby preventing damage to the integrated circuit substrate. A dielectric layer is then formed over the light barrier structure. The dielectric layer may be adapted for transferring heat generated by the laser thermal processing to the light barrier layer. Since the dielectric layer may be formed through oxidation of a top surface of the light barrier structure, a nitrogen rich barrier layer may be provided as a trench liner to prevent damage to sidewalls of the isolation structure during the oxidation process and further consumption of the sidewalls of the silicon substrate.

These and other features and advantages of the present invention are described below with reference to the drawings.

DETAILED DESCRIPTION OF THE PREFERRED EMBODIMENTS

In the following description, numerous specific details are set forth in order to fully illustrate preferred embodiments of the present invention. It will be apparent, however, that the present invention may be practiced without limitation to some specific details presented herein. For example, the isolation structure described is formed primarily through two layers, a dielectric layer and a light barrier layer. However, the isolation structure may be formed in an alternate manner to achieve the same function. For instance, the light barrier layer may be formed from multiple layers and materials.

In accordance with various embodiments of the invention, an isolation structure is formed. More particularly, a trench is etched in the integrated circuit substrate. A light barrier layer is then formed in the trench such that the light barrier layer at least partially fills the trench to create an light barrier structure. The light barrier layer is adapted for absorbing laser light applied during laser thermal processing, thereby preventing damage to the integrated circuit substrate. For instance, the light barrier layer may be a conductive layer such as polysilicon. A dielectric layer is then formed over the isolation structure. The dielectric layer may be adapted for transferring heat generated by the laser thermal processing to the light barrier layer. For instance, the dielectric layer may be formed through oxidation of a top surface of the light barrier layer or light barrier structure.

As described above, in order to form an isolation structure on an integrated circuit substrate, a trench is etched in the integrated circuit substrate. This may be accomplished through a conventional patterning and etch process. More particularly, a conformal photoresist layer is typically applied, which is subsequently patterned and etched.

Figure 1A:
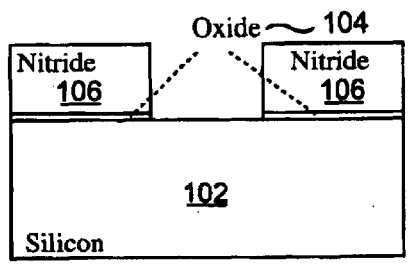
FIG. 1A depicts a cross-sectional view of a portion of a semiconductor wafer showing various stages in the patterning of a mask layer.

FIG. 1A depicts a cross-sectional view of a portion of a semiconductor wafer showing various stages in the patterning of a mask layer. As shown, integrated circuit substrate 102 is a conventional silicon substrate. An oxide layer 104 is formed over the integrated circuit substrate. For instance, a thin layer of oxide may be grown on top of the integrated circuit substrate, which may serve as a pad layer for a subsequent nitride mask layer. For instance, the thickness of the oxide layer 104 may be between 30 and 300 Angstroms, but most preferably 60 Angstroms. A nitride layer 106 is then deposited or grown over the oxide layer 104, and therefore over the integrated circuit substrate 102. For instance, the nitride layer 106 may be between 500 and 3000 Angstrom, but most preferably about 1100 Angstroms thick. The nitride layer 106 is then patterned such that an area to be etched is exposed. For instance, in order to pattern the nitride layer 106 as shown in FIG. 1A, photoresist may be deposited, exposed and developed, followed by a nitride and oxide etch to open one or more isolation regions in which trenches are to be etched.

Figure 1B:
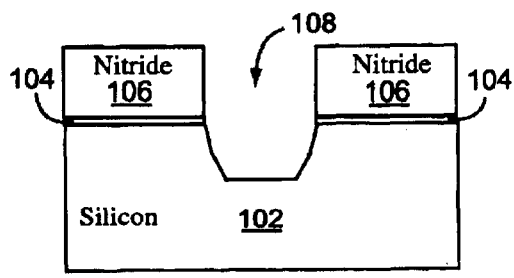
FIG. 1B depicts a cross-sectional view of a portion of the semiconductor wafer of FIG. 1A after the etching of a trench.

The exposed area in the patterned nitride layer 106 is then etched. FIG. 1B depicts a cross-sectional view of a portion of the semiconductor wafer of FIG. 1A after the etching of a trench. As shown, the trench 108 is defined by the exposed area in the patterned nitride layer 106. Although the sidewalls of the trench are shown to be substantially the same length and disposed at substantially the same angle, the sidewalls may also be of different lengths and disposed at different angles than one another due to microtrenching effects or pattern density changes. However, the aspect ratio between the sidewall length and the width of the isolation structure may range from about 1:0.5 to 1:5 depending on the different spacing requirements. For instance, the typical dimensions of the trench may be about 2500 Angstrom deep and 2000 Angstroms wide.

In order to complete fabrication of the isolation structure, a light barrier layer is deposited such that it at least partially fills the trench 108. In addition, a dielectric later is formed over the light barrier layer. Together, the light barrier layer and the dielectric layer serve to prevent heat during the thermal laser process from damaging the substrate as well as portions of the device and adjacent devices, as will be described in further detail below. Since the dielectric layer is preferably formed through oxidation of a top surface layer of the light barrier layer, it is possible that the oxidized region extends beyond the region desired. More particularly, it is possible that sidewalls of the light barrier layer within the trench could be inadvertently oxidized. As a result, it is desirable to protect the light barrier layer during oxidation such that oxidation is limited to oxidation in the vertical direction.

Figure 1C:
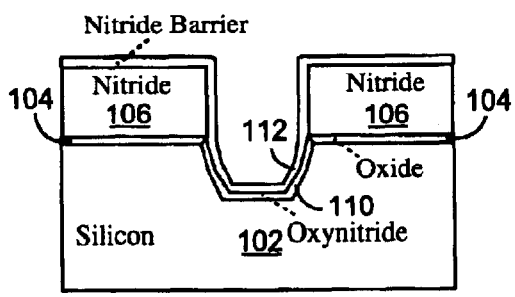
FIG. 1C depicts a cross-sectional view of a portion of the semiconductor wafer of FIG. 1B showing various stages in the formation of a barrier layer on top of an oxide liner in accordance with one embodiment of the present invention.

In accordance with one embodiment, oxidation of the isolation structure is limited through the use of a nitrogen rich barrier layer. FIG. 1C depicts a cross-sectional view of a portion of the semiconductor wafer of FIG. 1B showing various stages in the formation of a barrier layer on top of an oxide liner in accordance with one embodiment of the present invention. As shown, an oxide trench liner 110 is preferably formed over the patterned nitride layer 106 such that the oxide trench liner substantially conforms to the trench 108. For instance, the oxide trench liner 110 may be fabricated by a wet or dry oxidation step. The oxide trench liner 110 is preferably a thin layer. By way of example, the oxide trench liner may have a thickness of between 30 and approximately 200 Angstroms, but preferably about 50 Angstroms. A nitrogen rich barrier layer 112 is then deposited or grown on top of the oxide trench liner 110, which helps the nitrogen rich barrier layer 112 to adhere to the trench. The nitrogen rich barrier layer 112 may be manufactured either by deposition of nitride or by deposition of a thin amorphous silicon layer which is exposed to a nitrogen plasma to incorporate nitrogen ions to achieve approximately 30 atomic percent nitrogen at the top surface of the amorphous silicon layer. For instance, the nitrogen rich barrier layer 112 may be between 20 and 50, but most preferably about 30 Angstroms thick.

Figure 1D:
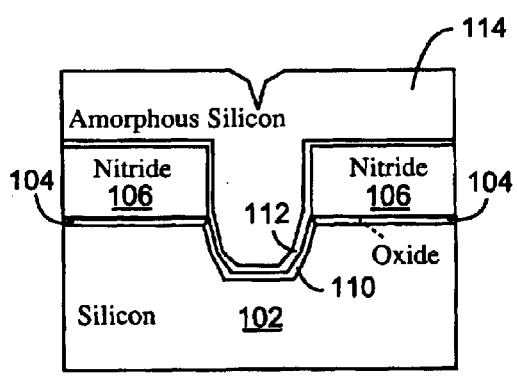
FIG. 1D depicts a cross-sectional view of a portion of the semiconductor wafer of FIG. 1C after the creation of a light barrier layer for a subsequent laser anneal in accordance with one embodiment of the present invention.

After the nitrogen rich barrier layer has been formed, a light barrier layer may be deposited. FIG. 1D depicts a cross-sectional view of a portion of the semiconductor wafer of FIG. 1C after the creation of a light barrier layer for a subsequent laser anneal in accordance with one embodiment of the present invention. As shown in FIG. 1D, a light barrier layer 114 is formed in the trench above the patterned nitride layer 106 such that the light barrier layer at least partially fills the trench to create an isolation structure. For instance, the light barrier layer 114 formed in the trench may be preferably approximately 2500 Angstroms thick. The light barrier layer 114 is adapted for absorbing laser light applied during laser thermal processing, thereby preventing damage to the integrated circuit substrate 102. For example, the light barrier layer 114 may be a conductive layer composed of one or more metals. The light barrier layer 114 is preferably polysilicon or amorphous silicon grown on top of the nitrogen rich barrier layer 112.

Figure 1E:
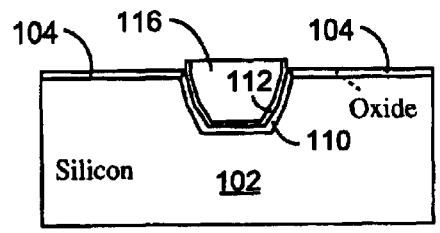
FIG. 1E depicts a cross-sectional view of a portion of the semiconductor wafer of FIG. 1D after removal of the excess light barrier layer material and planarization in accordance with one embodiment of the present invention.

FIG. 1E depicts a cross-sectional view of a portion of the semiconductor wafer of FIG. 1D after removal of the excess light barrier layer material (e.g., amorphous silicon) and planarization in accordance with one embodiment of the present invention. For instance, the light barrier layer 114 may be planarized through the use of chemical mechanical polishing (CMP) of the wafer surface. As shown, in this embodiment the nitride layer 106 may serve as an in situ polish stop. Thus, the wafer is polished such that the patterned nitride layer 106 is substantially removed, resulting in a light barrier structure 116 that at least partially fills the trench. In this manner, the dimensions of the light barrier structure 116 are defined. At this stage of the process, the surface of the light barrier layer may be planar, elevated or subsided with respect to the silicon substrate surface depending on the subsequent processing steps which may remove parts of the light barrier layer.

Figure 1F:
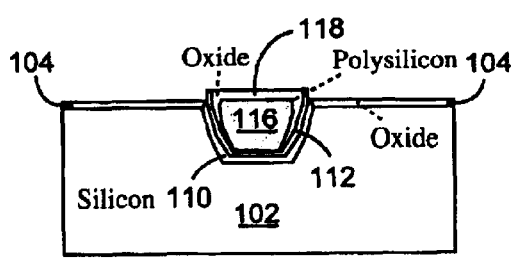
FIG. 1F depicts a cross-sectional view of a portion of the semiconductor wafer of FIG. 1E after oxidation in accordance with one embodiment of the present invention.

After the light barrier structure 116 is defined, this structure 116 is "capped" with a dielectric layer 118 in order to ensure that the final structure provides the desired electrical isolation. FIG. 1F depicts a cross-sectional view of a portion of the semiconductor wafer of FIG. 1E after oxidation in accordance with one embodiment of the present invention. As shown, the dielectric layer 118 is formed such that it caps the light barrier structure 116. For instance, the dielectric layer may be silicon dioxide. The dielectric layer 118 may be adapted for transferring heat generated by the laser thermal processing or from an overlying device structure (e.g., polysilicon gate or interconnect line) to the light barrier structure 116, as well as acting as an isolation between the light barrier structure 116 and an overlying device structure such as a polysilicon gate or interconnect line. Thus, the thickness of the dielectric layer 118 should be thin enough to enable heat generated during laser thermal processing (or other means) to be transferred to the light barrier structure 116. For instance, the thickness of the dielectric layer may be between 20 and 300, but most preferably approximately 50 Angstroms.

It is also desirable if the dielectric layer is transparent. As described above, an oxide layer is typically transparent. A reflective dielectric layer would reflect incoming laser light and increase the thermal energy within device structures on top of the isolation region. However, when the oxide has a thickness of approximately a multiple of a wavelength of the laser light applied during laser thermal processing, this causes reflection of at least a portion of the laser light according to well understood optical properties. The oxide is never fully reflective. Thus, in order to maximize reflection of the laser light during laser thermal processing, the dielectric layer 118 should be approximately a multiple (e.g., 2) of a wavelength of the laser light applied. The light and therefore heat that is not reflected is then absorbed by the light barrier structure 116, preventing damage to the substrate 102 as well as device elements (e.g., gate and/or interconnect lines).

In accordance with one embodiment, the dielectric layer 118 is formed over the light barrier structure by oxidizing a top surface of the light barrier structure 116 to a non-electrical as well as translucent state, for example, via thermal oxidation according to well known procedures. Thus, a top surface or portion of the light barrier structure may be "converted" to the dielectric layer by thermal processing. During this process, the nitrogen rich barrier layer 112 helps to prevent oxidation of sidewalls of the light barrier layer (and the isolation structure) when forming a dielectric layer over the light barrier structure. In other words, the nitrogen rich barrier layer 112 confines the oxidation of the light barrier structure 116 in the vertical direction. In this manner, the nitrogen rich barrier layer 112 prevents the sidewalls of the light barrier structure from being oxidized. As shown, the final isolation structure includes light barrier structure 116 as well as dielectric layer 118.

After the isolation structure is formed, conventional fabrication steps that are well known in the art, including formation of well, gate oxide, and gate electrode, are performed. More particularly, gate, source and drain formation may be performed by employing preamorphization implants followed by dopant implantation and laser annealing. The doping and preamorphization implants are chosen to achieve acceptable device performance and shallow junctions.

In one embodiment, the laser annealing process is performed with a 308 nm excimer laser in a pulsed mode. For instance, the pulse width may vary from between approximately 10 ns and approximately 100 ns, and the laser fluence may vary between approximately 0.1 J/cm2 and approximately 1.5 J/cm2 depending upon the desired melt depth.

Figure 1G:
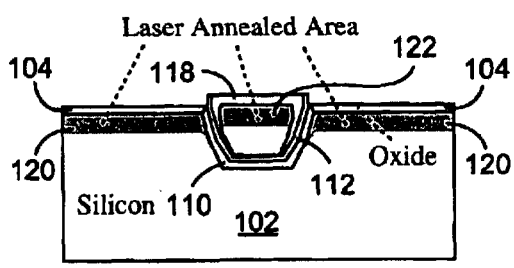
FIG. 1G depicts a cross-sectional view of a portion of the semiconductor wafer of FIG. 1F that illustrates the melted regions after exposure to a laser anneal in accordance with one embodiment of the present invention.

FIG. 1G depicts a cross-sectional view of a portion of the semiconductor wafer of FIG. 1F that illustrates the melted regions after exposure to a laser anneal in accordance with one embodiment of the present invention. As shown, melted regions 120 of the substrate and a melted region 122 of the isolation structure are formed during laser annealing. The light barrier layer 114 preferably has a thickness at least as thick as the proposed melt depth of the substrate 102, shown as shaded region 120, and may be thick enough to completely fill the trench structure. More specifically, the proposed melt depth is the proposed depth of the integrated circuit substrate to be melted during laser thermal processing. Thus, the melt depth is chosen to slightly overmelt the amorphous/crystalline interface created by the preamorphization implant. This ensures that end-of-range defects are annealed out completely. As described above, during the laser annealing step, the isolation structure is also partially melted, shown at region 122. However, since most of the isolation structure consists of polysilicon, the laser light is blocked from reaching the bottom of the isolation structure.

The above-disclosed shallow trench isolation structure may be used in Complimentary Metal Oxide Semiconductor (CMOS) technology, where complimentary transistors (NMOS and PMOS) are fabricated adjacent to each other and separated by the isolation structure.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope of the appended claims.

What is claimed is:

1. A method of manufacturing a semiconductor integrated circuit on a semiconductor substrate, the method comprising:

forming a trench in the semiconductor substrate;

forming in the trench a dual layer isolation structure comprising a light reflecting layer disposed directly on a light absorbing layer;

exposing the trench and an active region formed in the substrate to laser light having a predetermined wavelength and a predetermined fluence, the predetermined fluence being sufficient to laser anneal the active region; and reducing the fluence of the laser light reaching the substrate directly beneath the trench through the selection of the optical properties of the dual layer isolation structure such that the substrate region beneath the trench is not laser annealed.

2. The method as recited in claim 1, wherein the light absorbing layer comprises one of polysilicon and amorphous silicon.

3. The method as recited in claim 1, wherein the light absorbing layer comprises amorphous silicon.

4. The method as recited in claim 1, wherein the light absorbing layer comprises polysilicon.

5. The method as recited in claim 1, wherein the light reflecting layer comprises an oxide.

6. The method as recited in claim 1, wherein the thickness of the light reflecting layer is selected to maximize the reflectivity of the laser light reflecting layer to the predetermined wavelength of the laser light.

7. The method as recited in claim 1, wherein the thickness of the light reflecting layer is an integer multiple of the fraction of the predetermined wavelength of the incident laser light that exhibits the greatest reflectivity.

8. The method as recited in claim 1, wherein the light absorbing layer only partially fills the trench.

9. The method as recited in claim 1, wherein the light absorbing layer completely fills the trench.

10. The method as recited in claim 1, wherein the dielectric layer is silicon dioxide.

11. The method as recited in claim 1, further comprising:

depositing or growing a nitrogen rich barrier layer over the trench, wherein the nitrogen rich barrier layer prevents oxidation of sidewalls of the light barrier structure when forming a dielectric layer over the light barrier structure.

12. The method as recited in claim 11, further comprising:

forming an oxide trench liner substantially conforming to the trench;

wherein depositing or growing a nitrogen rich barrier layer comprises depositing or growing a nitrogen rich barrier layer over the oxide trench liner.

13. A method of manufacturing a semiconductor integrated circuit on a semiconductor substrate, the method comprising:

forming a trench in the semiconductor substrate;

forming in the trench a dual layer isolation structure comprising a laser light reflecting layer disposed directly on a laser light absorbing layer, the optical properties of the dual layer isolation structure selected to reduce the laser light radiation of a predetermined wavelength reaching the substrate region beneath the trench; and exposing the trench and a first region formed in the substrate to laser light having the predetermined wavelength such that the substrate in the first region is melted by the laser and the substrate in the region beneath the trench is not melted.

14. The method as recited in claim 13, wherein the laser light reflecting layer comprises amorphous silicon and the light reflecting layer comprises an oxide.

15. The method as recited in claim 13, wherein the laser light reflecting layer comprises polysilicon.

16. The method as recited in claim 14, wherein the thickness of the light reflecting layer is selected to maximize the reflectivity of the laser light reflecting layer to the predetermined wavelength of the laser light.

17. The method as recited in claim 14, wherein the thickness of the light reflecting layer is an integer multiple of the fraction of the predetermined wavelength of the incident laser light that exhibits the greatest reflectivity.

* * * * *